US012776737B2

(12) United States Patent
Sugie

(10) Patent No.: US 12,776,737 B2
(45) Date of Patent: Oct. 27, 2026

(54) AMPLIFIER CIRCUIT, MOTOR DRIVER CIRCUIT, POSITIONING DEVICE, AND HARD DISK DEVICE

(71) Applicant: ROHM Co., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 132 days.

(21) Appl. No.: 18/410,044

(22) Filed: Jan. 11, 2024

(65) Prior Publication Data

US 2024/0250628 A1 Jul. 25, 2024

(30) Foreign Application Priority Data

Jan. 20, 2023 (JP) ................................ 2023-007498

(51) Int. Cl.
*H02P 25/06* (2016.01)
*H03F 3/45* (2006.01)
*G11B 5/55* (2006.01)

(52) U.S. Cl.
CPC ......... *H02P 25/06* (2013.01); *H03F 3/45479* (2013.01); *G11B 5/5521* (2013.01)

(58) Field of Classification Search
CPC .... H02P 25/06; H03F 3/45479; G11B 5/5521
See application file for complete search history.

(56) References Cited

U.S. PATENT DOCUMENTS 5,416,442 A * 5/1995 Hobrecht .................. H03F 1/22 330/156
10,594,263 B2 * 3/2020 Amorosa ................ H04L 27/14
11,683,018 B2 * 6/2023 Devam ............... H03F 3/45183 330/253
11,949,363 B2 * 4/2024 Sugie ..................... G11B 19/20
2023/0091543 A1 * 3/2023 Devam ................. H03F 3/4521 330/253

* cited by examiner

*Primary Examiner* — Thai T Dinh
(74) *Attorney, Agent, or Firm* — CHIP Law Group

(57) ABSTRACT

Provided is an amplifier circuit including an inverting input terminal configured to receive a first voltage, an output terminal, and a class A amplifier circuit configured to generate, at the output terminal, an output voltage that changes in reverse polarity with respect to the first voltage, in which a bias current of an output stage of the class A amplifier circuit changes according to the first voltage.

8 Claims, 7 Drawing Sheets

AMPLIFIER CIRCUIT, MOTOR DRIVER CIRCUIT, POSITIONING DEVICE, AND HARD DISK DEVICE

CROSS REFERENCE TO RELATED APPLICATIONS

This application claims priority benefit of Japanese Patent Application No. JP 2023-007498 filed in the Japan Patent Office on Jan. 20, 2023. Each of the above-referenced applications is hereby incorporated herein by reference in its entirety.

BACKGROUND

The present disclosure relates to an amplifier circuit.

A linear motor (linear actuator) that positions a target object is used in various electronic apparatuses and industrial machines. A voice coil motor is one of linear motors. The voice coil motor allows the position of a movable element to be controlled according to a driving current supplied. A driving circuit of the voice coil motor detects the current flowing through the voice coil motor, and performs feedback control such that the detected current approaches a target current defining a target position.

DETAILED DESCRIPTION

Outline of Embodiments

Figure 1:
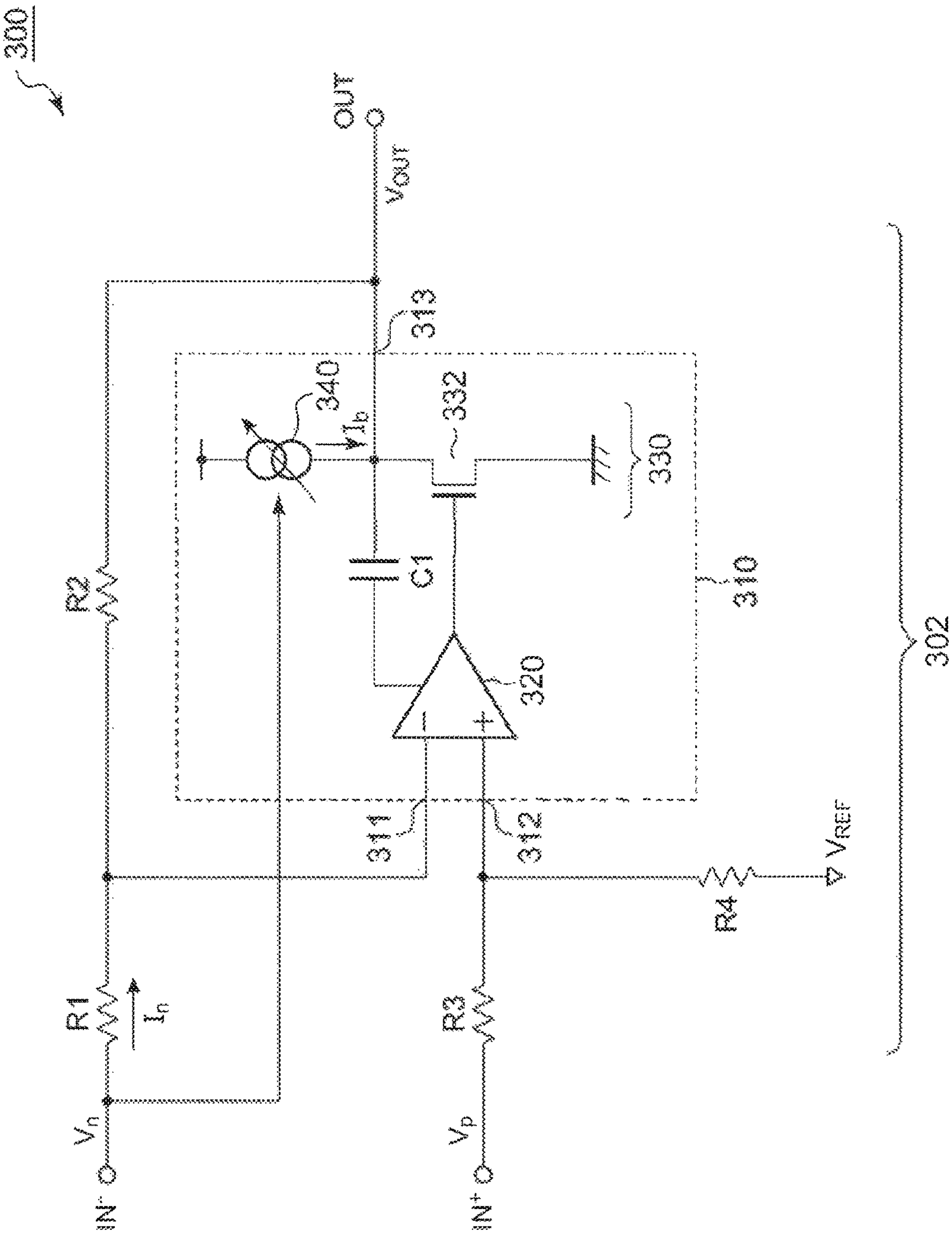
FIG. 1 circuit diagram of an amplifier circuit according to an embodiment.

An outline of a few illustrative embodiments of the present disclosure will be described. This outline describes, in a brief manner, a few concepts of one or a plurality of embodiments as an introduction to the following detailed description for the purpose of achieving basic understanding of the embodiments, but does not limit the scope of the technology or the disclosure. This outline neither is a comprehensive outline of all conceivable embodiments nor is intended to identify important elements of all of the embodiments or demarcate the scope of some or all of aspects. For convenience, "one embodiment" may be used to refer to one embodiment (an example or a modification) or a plurality of embodiments (examples or modifications) disclosed in the present specification.

An amplifier circuit according to one embodiment includes an inverting input terminal configured to receive a first voltage, an output terminal, and a class A amplifier circuit configured to generate, at the output terminal, an output voltage that changes in reverse polarity with respect to the first voltage. A bias current of an output stage of the class A amplifier circuit changes according to the first voltage.

According to this configuration, the bias current can be reduced in a range in which the operation of the class A amplifier circuit is not hindered. It is thus possible to realize a high-speed operation and stability of the circuit while suppressing an increase in power consumption.

In one embodiment, the bias current may be substantially constant while the first voltage is higher than a predetermined threshold value, and may be increased as the first voltage becomes lower in a region in which the first voltage is lower than the threshold value.

In one embodiment, the class A amplifier circuit may include a transistor that has a source grounded, a current mirror circuit that has an output connected to a drain of the transistor, and a resistance connected to and between an input of the current mirror circuit and the inverting input terminal. According to this configuration, a current that substantially linearly changes with respect to the first voltage can be generated in a region in which the first voltage is lower than the threshold value.

In one embodiment, a non-inverting input terminal configured to receive a second voltage may be further provided. The class A amplifier circuit may include an operational amplifier that has a class A output stage, a first resistance connected to and between an inverting input of the operational amplifier and the inverting input terminal, a second resistance connected to and between the inverting input of the operational amplifier and an output of the operational amplifier, a third resistance connected to and between a non-inverting input of the operational amplifier and the non-inverting input terminal, and a fourth resistance connected to and between the non-inverting input of the operational amplifier and a reference voltage terminal.

In one embodiment, the amplifier circuit may further include a first pin to be connected to one terminal of a sense resistance disposed on a path of a current as a detection target, and a second pin to be connected to another terminal of the sense resistance. The inverting input terminal of the amplifier circuit may be connected to the first pin, and the non-inverting input terminal of the amplifier circuit may be connected to the second pin.

In one embodiment, the class A amplifier circuit may include an operational amplifier that has a class A output stage and that is configured to receive a reference voltage at a non-inverting input, a first resistance connected to and between an inverting input of the operational amplifier and the inverting input terminal, and a second resistance connected to and between the inverting input of the operational amplifier and an output of the operational amplifier.

A motor driver circuit according to one embodiment may include a first output pin to be connected to one terminal of a series connection circuit of a motor and a sense resistance, a second output pin to be connected to another terminal of the series connection circuit, a current sense pin to be connected to a connection node between the motor and the sense resistance, a driving circuit configured to generate a driving voltage between the first output pin and the second output pin, a current sense amplifier configured to amplify a voltage drop across the sense resistance, and a control circuit configured to control the driving circuit according to an output of the current sense amplifier. The current sense amplifier may include the amplifier circuit. The inverting input terminal of the amplifier circuit may be connected to the current sense pin, and the non-inverting input terminal of the amplifier circuit may be connected to the second output pin.

In one embodiment, the motor driver circuit may be monolithically integrated on one semiconductor substrate.

"Monolithically integrated" includes a case where all of circuit constituent elements are formed on the semiconductor substrate and a case where main circuit constituent elements are integrated. Some of resistances, capacitors, and the like may be provided on the outside of the semiconductor substrate for adjustment of circuit constants. Integrating the circuit on one chip can reduce a circuit area, and hold characteristics of the circuit elements uniform.

A positioning device according to one embodiment includes a linear motor, and one of the above-described motor driver circuits configured to drive the linear motor.

A hard disk device according to one embodiment includes the above-described positioning device.

Embodiment

A preferred embodiment will hereinafter be described with reference to the drawings. Identical or equivalent constituent elements, members, and processing illustrated in each drawing are identified by the same reference signs, and repeated description thereof will be omitted as appropriate. In addition, the embodiment is not restrictive of the disclosure and the technology and is illustrative, and all features described in the embodiment and combinations thereof are not necessarily essential to the disclosure and the technology.

In the present specification, a "state in which a member A is connected to a member B" includes a case where the member A and the member B are physically directly connected to each other and a case where the member A and the member B are indirectly connected to each other via another member that does not essentially affect a state of electric connection between the member A and the member B or that does not impair functions or effects produced by the coupling of the member A and the member B.

Similarly, a "state in which a member C is provided between the member A and the member B" includes not only a case where the member A and the member C or the member B and the member C are directly connected to each other but also a case where the member A and the member C or the member B and the member C are indirectly connected to each other via another member that does not essentially affect a state of electric connection between the member A and the member C or the member B and the member C or that does not impair functions or effects produced by the coupling of the member A and the member C or the member B and the member C.

In addition, axes of ordinates and axes of abscissas in waveform charts and timing diagrams illustrated in the present specification are enlarged or reduced as appropriate in order to facilitate understanding, and each waveform illustrated therein is simplified in order to facilitate understanding.

FIG. 1 is a circuit diagram of an amplifier circuit 300 according to an embodiment. The amplifier circuit 300 includes an inverting input terminal IN-, a non-inverting input terminal IN+, an output terminal OUT, and a class A amplifier circuit 302.

The class A amplifier circuit 302 is a differential amplifier circuit that amplifies a difference between a first voltage Vn of the inverting input terminal IN– and a second voltage Vp of the non-inverting input terminal IN+. An output voltage $V_{OUT}$ of the output terminal OUT is expressed by Equation (1).

$$V_{OUT} = (Vp - Vn) \times g + V_{REF} \tag{1}$$

g is gain.

The output voltage $V_{OUT}$ can be said to change in reverse polarity with respect to the first voltage Vn, and change in the same polarity as the second voltage Vp.

The class A amplifier circuit 302 includes an operational amplifier 310 and first to fourth resistances R1 to R4. The first resistance R1 is connected to and between the inverting input terminal IN– and an inverting input 311 of the operational amplifier 310. The second resistance R2 is connected to and between the inverting input 311 of the operational amplifier 310 and an output 313 of the operational amplifier 310. The third resistance R3 is connected to and between the non-inverting input terminal IN+ and a non-inverting input 312 of the operational amplifier 310. The fourth resistance R4 is connected to and between a reference voltage node $V_{REF}$ and the non-inverting input 312 of the operational amplifier 310. R1=R3 and R2=R4 hold. The gain g is R2/R1.

The operational amplifier 310 includes a differential input stage 320, a class A output stage 330, and a phase compensating capacitor C1. The differential input stage 320 can include a differential input circuit and a gain circuit.

The output stage 330 includes an output transistor 332 and a bias circuit 340. The output transistor 332 is an N-channel metal oxide semiconductor (NMOS) transistor whose source is grounded.

The bias circuit 340 is connected to a drain of the output transistor 332. The bias circuit 340 supplies a bias current Ib. The output transistor 332 may be a bipolar transistor. In that case, it suffices to read the source as an emitter, and read the drain as a collector.

In the amplifier circuit 300, the bias current Ib of the output stage 330 of the class A amplifier circuit 302 changes according to the first voltage Vn of the inverting input terminal IN–.

Figure 2:
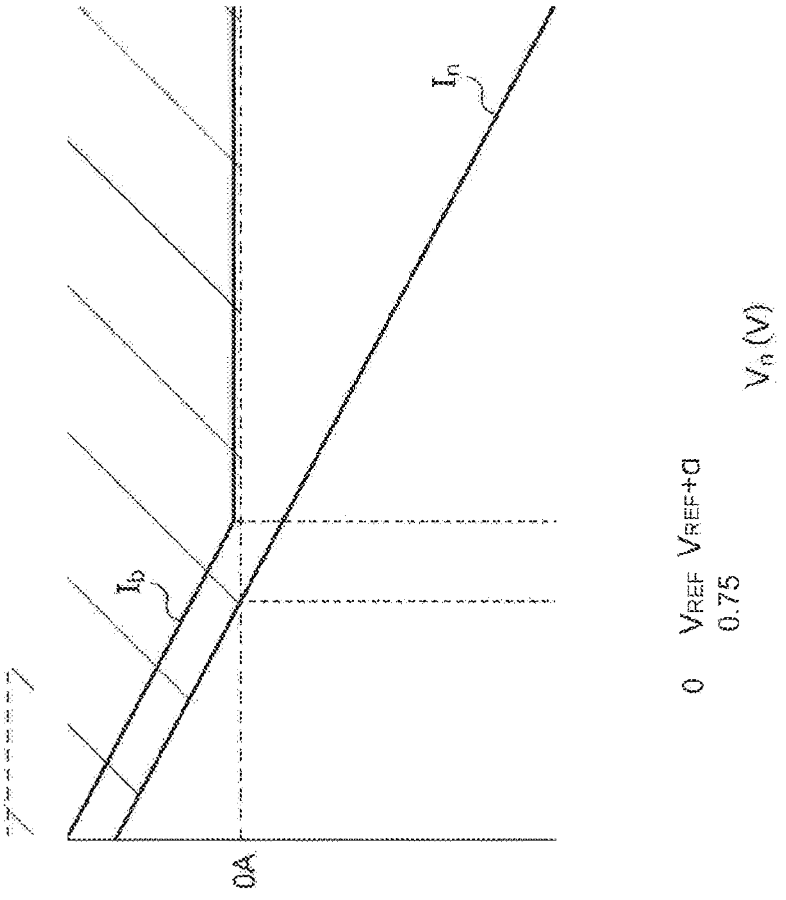
FIG. 2 is a diagram illustrating a relation between a bias current Ib and a first voltage Vn.

FIG. 2 is a diagram illustrating a relation between the bias current Ib and the first voltage Vn. An axis of abscissas indicates the first voltage Vn. An axis of ordinates indicates the bias current Ib. A current $I_n$ is a current flowing through the IN– terminal. A direction in which the current $I_n$ flows in from the IN– terminal is taken as a negative direction. A direction in which the current $I_n$ flows out of the IN– terminal is taken as a positive direction.

Figure 3:
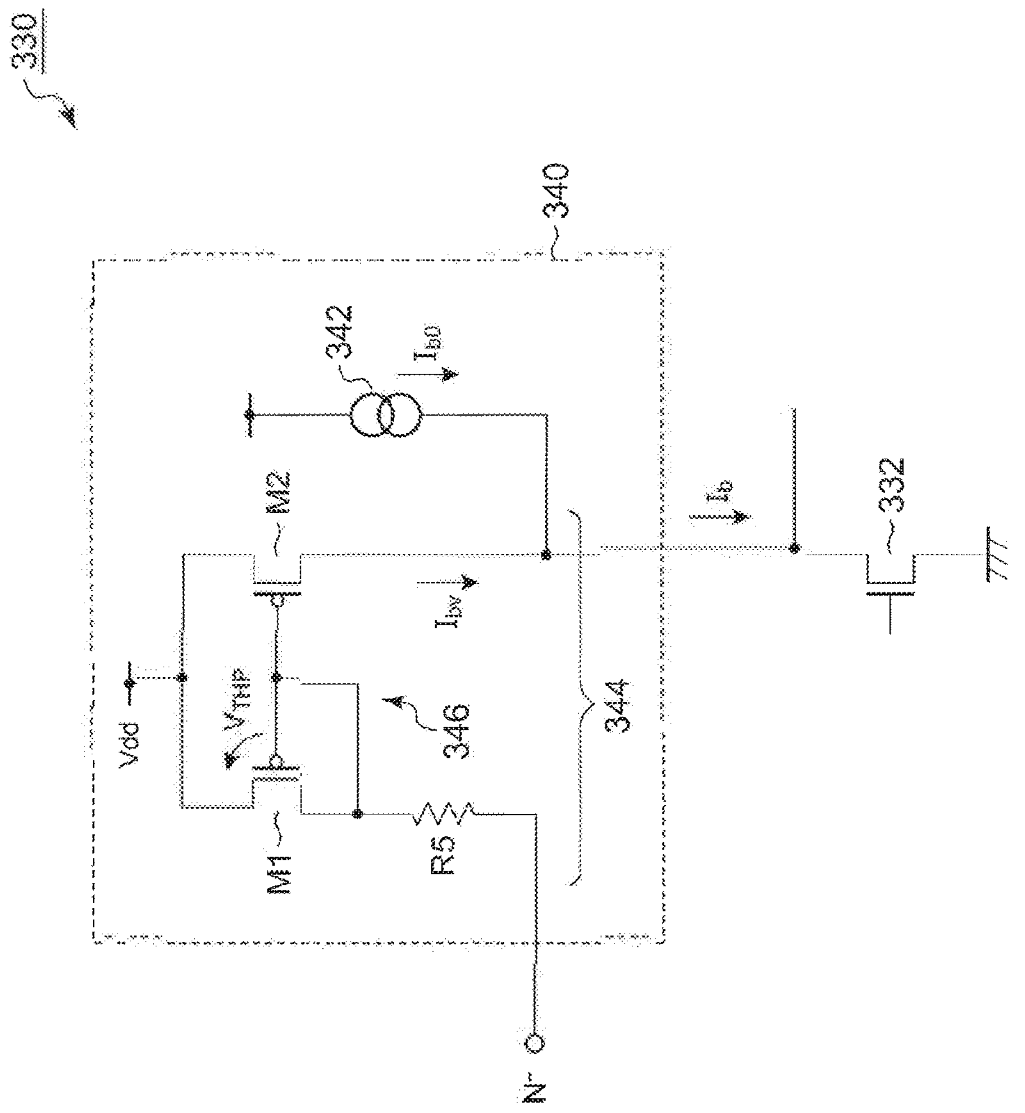
FIG. 3 is a circuit diagram illustrating an example of a configuration of an output stage of an operational amplifier.

FIG. 3 is a diagram illustrating a relation between the bias current Ib and the first voltage Vn. An axis of abscissas indicates the first voltage Vn. An axis of ordinates indicates the bias current Ib. A current $I_n$ is a current flowing through the IN– terminal. A direction in which the current $I_n$ flows in from the IN– terminal is taken as a negative direction. A direction in which the current $I_n$ flows out of the IN– terminal is taken as a positive direction.

Suppose that $V_{REF}$=0.75 V and that Vp=–1.5 V. In addition, suppose that R1=R2=R3=R4=R and that the gain g is 1. Vn is swept in a positive direction from Vp=–1.5 V.

When Vn=Vp=–1.5 V, $V_{OUT}$=$V_{REF}$=0.75 V. The current $I_n$ at this time is $$I_n = (V_{OUT} - Vn)/2R$$

When R=5.6 kΩ, $$I_n = (0.75 + 1.5)/(2 \times 5.6) = 200\ \mu A$$

Also when $V_n = V_{REF}$ (=0.75 V), $V_{OUT} = V_{REF} = 0.75$ V. At this time, $Vn = V_{OUT}$, and thus, the current $I_n$ is 0 A.

$I_n$ the present embodiment, there is set the threshold voltage $V_{REF}+\alpha$ which has a higher voltage level than a voltage $V_{REF}$ at which the current $I_n$ is zero. Further, in a region where $V_{REF}+\alpha<Vn$, the bias current Ib is substantially constant, and in a region where $Vn<V_{REF}+\alpha$, the bias current Ib is increased as Vn becomes lower.

Operation of the amplifier circuit 300 has been described above. Advantages thereof will next be described.

For comparison, a bias point $Ib_{(A)}$ of an ordinary class A amplifier in the related art is illustrated. In the class A amplifier in the related art, a large bias current flows at all times irrespective of the magnitude of the first voltage Vn, and a hatched part represents unnecessary current consumption.

In contrast, according to the amplifier circuit 300 of the embodiment, the bias current Ib becomes very small in a state in which the first voltage $V_n$ is high. Thus, low power consumption can be realized.

In addition, even in an operation region in which the first voltage $V_n$ is lower than the threshold voltage $V_{REF}+\alpha$ and a positive current $I_n$ flows, low power consumption can be realized while a class A operation is ensured, by increasing the bias current Ib along the straight line of the current $I_n$.

FIG. 3 is a circuit diagram illustrating an example of a configuration of the output stage 330 of the operational amplifier 310. The output stage 330 includes the output transistor 332 and the bias circuit 340. The bias circuit 340 includes a constant- current source 342 and a variable current source 344. The constant-current source 342 generates a constant current Ibo that does not depend on the first voltage Vn. The variable current source 344 generates a variable current Iby that linearly changes with respect to Vn in the region where $Vn<V_{REF}+\alpha$.

The variable current source 344 includes a current mirror circuit 346 and a resistance R5. The resistance R5 is connected to and between the non-inverting input terminal IN− and an input of the current mirror circuit 346. The current mirror circuit 346 includes PMOS transistors M1 and M2.

In this configuration, when the voltage Vn of the IN− terminal becomes lower than a threshold voltage $Vdd-V_{THP}$, a current $I=(Vdd-V_{THP}-Vn)$ starts to flow through the resistance R5, and the current $Ib_v$ starts to flow. For example, supposing that Vdd=1.5 V and $V_{THP}=0.2$ V, the current $Ib_v$ flows when Vn becomes lower than 1.3 V. That is, the threshold value $V_{REF}+\alpha$ is $Vdd-V_{THP}$.

A modification of the amplifier circuit 300 will next be described. In the embodiment, the amplifier circuit 300 is a differential amplifier circuit. However, the present disclosure is not limited to this.

Figure 4:
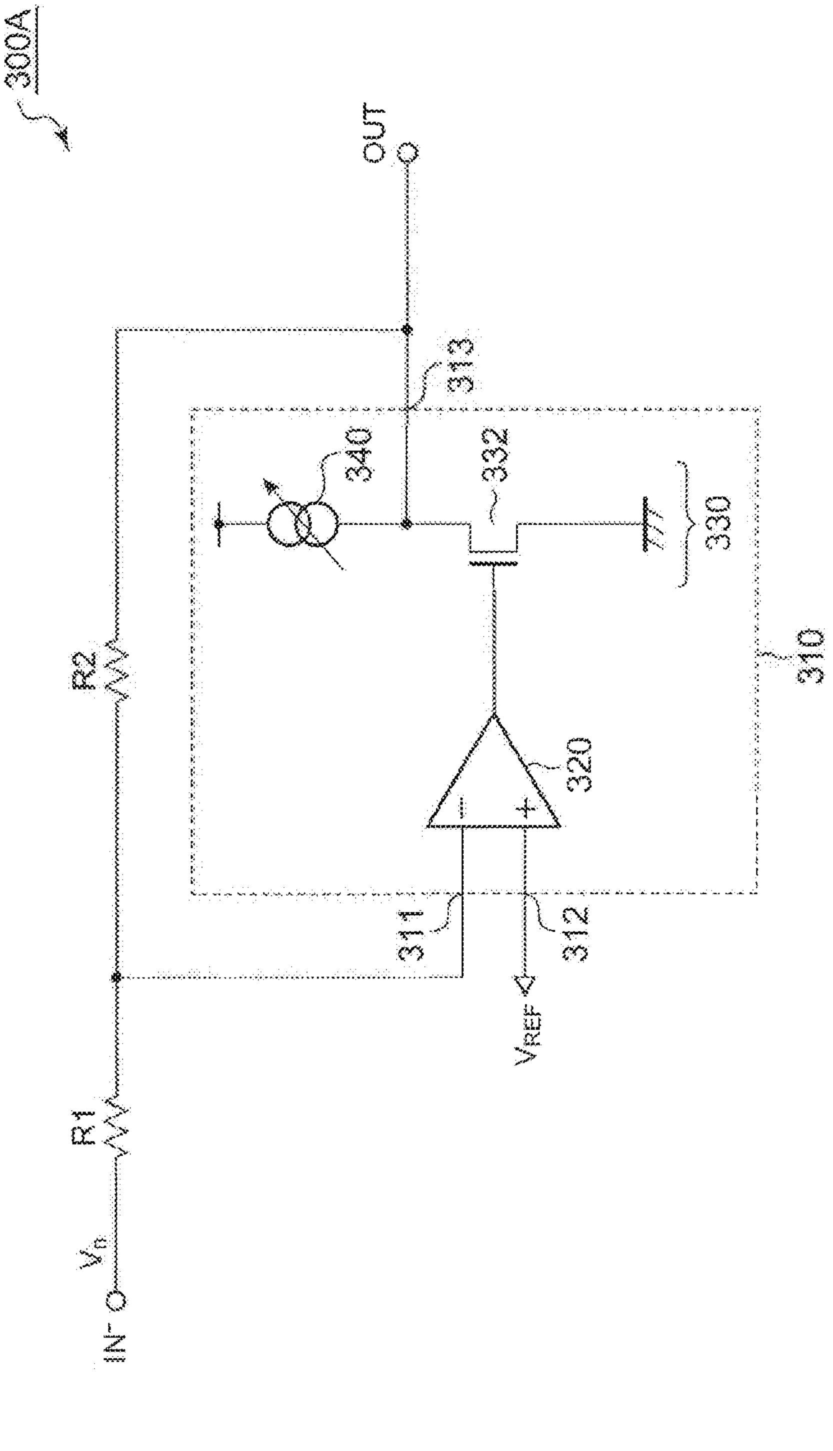
FIG. 4 is a circuit diagram of an amplifier circuit according to a modification.

FIG. 4 is a circuit diagram of an amplifier circuit 300A according to a modification. The amplifier circuit 300A is an inverting amplifier. The amplifier circuit 300A includes an operational amplifier 310, a first resistance R1, and a second resistance R2. The operational amplifier 310 has a configuration similar to that in FIG. 1.

The first resistance R1 is connected to and between an inverting input terminal IN− and the inverting input 311 of the operational amplifier 310. The second resistance R2 is connected to and between the inverting input 311 of the operational amplifier 310 and the output 313 of the operational amplifier 310. A reference voltage $V_{REF}$ is input to the non-inverting input 312 of the operational amplifier 310.

(Application)

An application of the amplifier circuit 300 will next be described. The amplifier circuit 300 can be used for current detection. The amplifier circuit 300 is, for example, mounted in a motor driver circuit.

Figure 5:
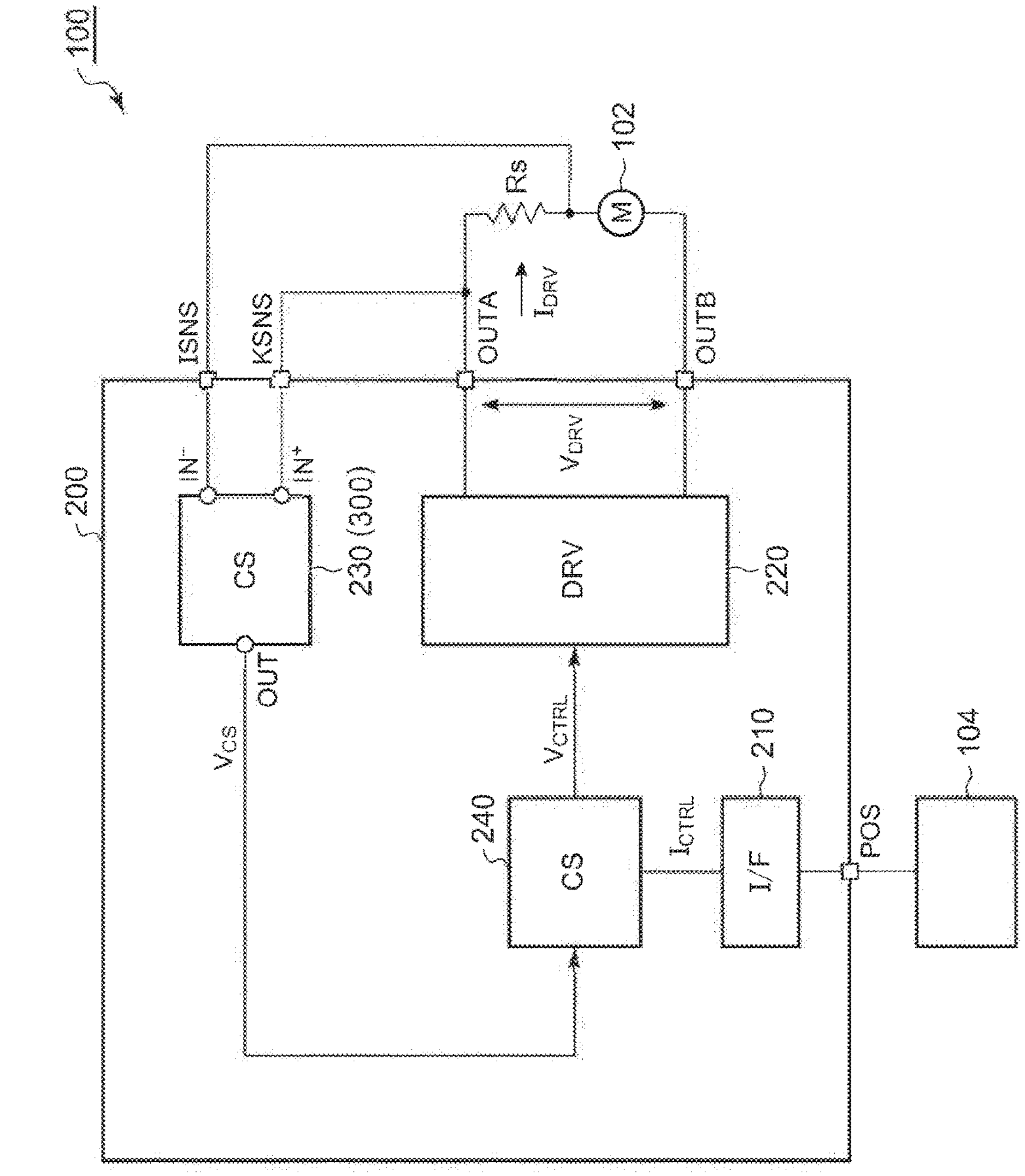
FIG. 5 is a circuit diagram of a positioning device including the motor driver circuit.

FIG. 5 is a circuit diagram of a positioning device 100 including a motor driver circuit 200. The positioning device 100 includes a linear motor 102, a high level controller 104, and the motor driver circuit 200.

The high level controller 104 controls the positioning device 100 in an integrated manner. The high level controller 104 generates position control data POS indicating a target position of the linear motor 102, and transmits the position control data POS to the motor driver circuit 200. The high level controller 104 includes, for example, a microcontroller, a field programmable gate array (FPGA), or an application specific integrated circuit (ASIC).

The motor driver circuit 200 includes a first output pin (A-phase output) OUTA, a second output pin (B-phase output) OUTB, and a current sense pin ISNS. One terminal of the linear motor 102 is connected to the OUTA pin via a sense resistance $R_S$. Another terminal of the linear motor 102 is connected to the OUTB pin. The ISNS pin and a KSNS pin are connected to the two terminals of the sense resistance $R_S$. The KSNS pin may be the same pin as the OUTA pin, or may be independent of the OUTA pin.

The motor driver circuit 200 receives the position control data POS, and supplies a driving current $I_{DRV}$ of an amount corresponding to the position control data POS to the linear motor 102. The linear motor 102 is, for example, a voice coil motor. A movable element of the voice coil motor is displaced by an amount corresponding to the driving current $I_{DRV}$ that flows through the linear motor 102.

A configuration of the motor driver circuit 200 will be described. The motor driver circuit 200 includes a current command generating unit 210, a driving circuit 220, a current sense amplifier 230, and a control circuit 240. The motor driver circuit 200 is a functional integrated circuit (IC) integrated on one semiconductor substrate.

The current command generating unit 210 receives the position control data POS from the high level controller 104, and generates an analog or digital current command $I_{CTRL}$ indicating a target amount of the driving current $I_{DRV}$.

The driving circuit 220 generates a driving voltage $V_{DRV}$ between the OUTA pin and the OUTB pin, and supplies the driving current $I_{DRV}$ to the linear motor 102.

The current sense amplifier 230 amplifies a voltage drop Vs across the sense resistance $R_S$, and thereby generates a current detection signal $V_{CS}$. The control circuit 240 generates a voltage command VCTRL that defines a target value of the driving voltage $V_{DRV}$, such that the current detection signal $V_{CS}$ approaches the current command $I_{CTRL}$ generated by the current command generating unit 210. The control circuit 240 thereby performs feedback control of the driving circuit 220. The control circuit 240 may include an analog circuit including an error amplifier, or may include a digital circuit including a proportional-integral (PI) compensator or a proportional-integral-differential (PID) compensator.

The control circuit 240 may perform pulse width modulation (PWM) control of the driving circuit 220. In that case, the voltage command $V_{CTRL}$ is a PWM signal. The control circuit 240 may perform linear control of the driving circuit 220. In that case, the voltage command $V_{CTRL}$ is an analog voltage.

The current sense amplifier 230 includes the amplifier circuit 300 described above. Specifically, the inverting input IN− of the amplifier circuit 300 is connected to the ISNS pin, that is, one terminal of the sense resistance $R_S$, and the non-inverting input IN+ of the amplifier circuit 300 is connected to the KSNS pin, that is, another terminal of the sense resistance $R_S$. The amplifier circuit 300 amplifies the voltage drop across the sense resistance $R_S$, and thereby generates the current detection signal $V_{CS}$ that linearly changes with respect to the driving current $I_{DRV}$.

Figure 6:
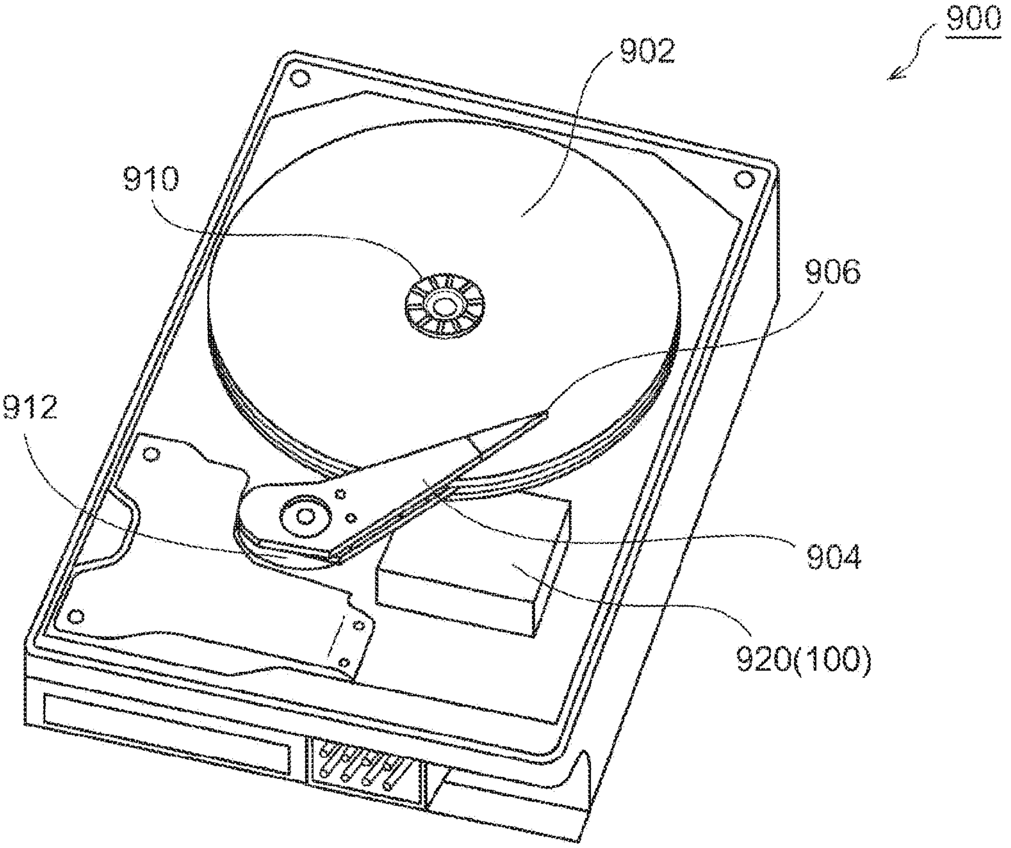
FIG. 6 is a diagram illustrating a hard disk device including the motor driver circuit.
Figure 7:
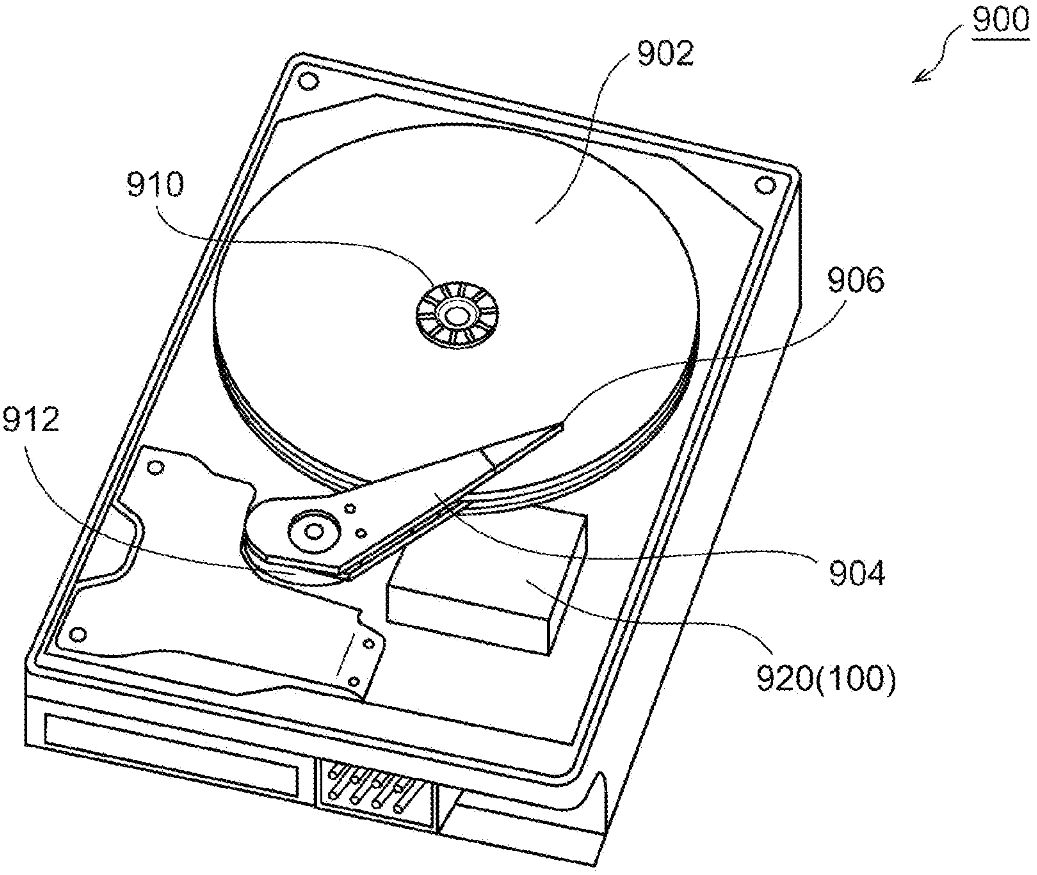

FIG. 6 is a diagram illustrating a hard disk device 900 including the motor driver circuit 200. The hard disk device 900 includes a platter 902, a swing arm 904, a head 906, a spindle motor 910, a seek motor 912, and a motor driver circuit 920. The motor driver circuit 920 drives the spindle motor 910 and the seek motor 912.

The seek motor 912 is a voice coil motor. The motor driver circuit 200 according to the embodiment is included in the motor driver circuit 920. The motor driver circuit 200 drives the seek motor 912. The seek motor 912 positions the head 906 via the swing arm 904.

In the present disclosure, the configuration and the type of the linear motor as a driving target are not particularly limited to any kind. For example, the present disclosure is applicable also to the driving of a voice coil motor of a spring return type or other linear actuators. Alternatively, the motor as a driving target may be a spindle motor.

Applications of the positioning device 100 are not limited to the hard disk device either. The positioning device 100 can be applied also to a positioning mechanism for a lens of a camera, for example.

Supplementary Notes

In the present specification, the following technology is disclosed.

Item 1

An amplifier circuit including:
- an inverting input terminal configured to receive a first voltage;
- an output terminal; and
- a class A amplifier circuit configured to generate, at the output terminal, an output voltage that changes in reverse polarity with respect to the first voltage, in which
- a bias current of an output stage of the class A amplifier circuit changes according to the first voltage.

Item 2

The amplifier circuit according to Item 1, in which the bias current is substantially constant while the first voltage is higher than a predetermined threshold value, and is increased as the first voltage becomes lower in a region in which the first voltage is lower than the threshold value.

Item 3

The amplifier circuit according to Item 1 or 2, in which the class A amplifier circuit includes
- a transistor that has a source grounded,
- a current mirror circuit that has an output connected to a drain of the transistor, and
- a resistance connected to and between an input of the current mirror circuit and the inverting input terminal.

Item 4

The amplifier circuit according to any one of Items 1 through 3, further including:
- a non-inverting input terminal configured to receive a second voltage,
- in which the class A amplifier circuit includes
  - an operational amplifier that has a class A output stage,
  - a first resistance connected to and between an inverting input of the operational amplifier and the inverting input terminal,
  - a second resistance connected to and between the inverting input of the operational amplifier and an output of the operational amplifier,
  - a third resistance connected to and between a non-inverting input of the operational amplifier and the non-inverting input terminal, and
  - a fourth resistance connected to and between the non-inverting input of the operational amplifier and a reference voltage terminal.

Item 5

The amplifier circuit according to Item 4, further including:
- a first pin to be connected to one terminal of a sense resistance disposed on a path of a current as a detection target; and
- a second pin to be connected to another terminal of the sense resistance, in which
- the inverting input terminal of the amplifier circuit is connected to the first pin, and the non-inverting input terminal of the amplifier circuit is connected to the second pin.

Item 6

The amplifier circuit according to any one of Items 1 through 3, in which
- the class A amplifier circuit includes
  - an operational amplifier that has a class A output stage and that is configured to receive a reference voltage at a non-inverting input,
  - a first resistance connected to and between an inverting input of the operational amplifier and the inverting input terminal, and
  - a second resistance connected to and between the inverting input of the operational amplifier and an output of the operational amplifier.

Item 7

A motor driver circuit including:
- a first output pin to be connected to one terminal of a series connection circuit of a motor and a sense resistance;
- a second output pin to be connected to another terminal of the series connection circuit;
- a current sense pin to be connected to a connection node between the motor and the sense resistance;
- a driving circuit configured to generate a driving voltage between the first output pin and the second output pin;

a current sense amplifier configured to amplify a voltage drop across the sense resistance; and a control circuit configured to control the driving circuit according to an output of the current sense amplifier, in which the current sense amplifier includes the amplifier circuit according to Item 4, and the inverting input terminal of the amplifier circuit is connected to the current sense pin, and the non-inverting input terminal of the amplifier circuit is connected to the second output pin.

Item 8

The motor driver circuit according to Item 7, in which the motor driver circuit is monolithically integrated on one semiconductor substrate.

Item 9

A positioning device including:

a linear motor; and the motor driver circuit according to Item 7 or 8, the motor driver circuit being configured to drive the linear motor.

Item 10

A hard disk device including:

the positioning device according to Item 9.

According to a certain mode of the present disclosure, it is possible to provide an amplifier circuit that can perform high-speed operation while suppressing an increase in power consumption.

It should be understood by those skilled in the art that various modifications, combinations, sub-combinations and alterations may occur depending on design requirements and other factors insofar as they are within the scope of the appended claims or the equivalents thereof.

What is claimed is:

1. An amplifier circuit comprising:

an inverting input terminal configured to receive a first voltage;

an output terminal; and a class A amplifier circuit configured to generate, at the output terminal, an output voltage that changes in reverse polarity with respect to the first voltage, wherein the class A amplifier circuit includes a first resistance and a bias circuit, the first resistance of the class A amplifier circuit is connected to the inverting input terminal, the bias circuit is configured to supply a bias current to an output stage of the class A amplifier circuit, the bias circuit is configured to control the bias current based on the first voltage received at the inverting input terminal, and the bias current is substantially constant while the first voltage is higher than a predetermined threshold value, and is increased as the first voltage becomes lower than the predetermined threshold value.

2. The amplifier circuit according to claim 1, wherein the class A amplifier circuit further includes:

a transistor that has a source grounded, a current mirror circuit that has an output connected to a drain of the transistor, and a resistance connected to and between an input of the current mirror circuit and the inverting input terminal.

3. The amplifier circuit according to claim 1, further comprising:

a non-inverting input terminal configured to receive a second voltage, wherein the class A amplifier circuit further includes:

an operational amplifier that has the output stage, the first resistance connected to and-between an inverting input of the operational amplifier and the inverting input terminal, a second resistance connected to and between the inverting input of the operational amplifier and an output of the operational amplifier, a third resistance connected to and between a non-inverting input of the operational amplifier and the non-inverting input terminal, and a fourth resistance connected to and between the non-inverting input of the operational amplifier and a reference voltage terminal.

4. The amplifier circuit according to claim 3, further comprising:

a first pin to be connected to one terminal of a sense resistance disposed on a path of a current as a detection target; and a second pin to be connected to another terminal of the sense resistance, wherein the inverting input terminal of the amplifier circuit is connected to the first pin, and the non-inverting input terminal of the amplifier circuit is connected to the second pin.

5. A motor driver circuit comprising:

a first output pin to be connected to one terminal of a series connection circuit of a motor and a sense resistance;

a second output pin to be connected to another terminal of the series connection circuit;

a current sense pin to be connected to a connection node between the motor and the sense resistance;

a driving circuit configured to generate a driving voltage between the first output pin and the second output pin;

a current sense amplifier configured to amplify a voltage drop across the sense resistance; and a control circuit configured to control the driving circuit according to an output of the current sense amplifier, wherein the current sense amplifier comprises the amplifier circuit of claim 3, and the inverting input terminal of the amplifier circuit is connected to the current sense pin, and the non-inverting input terminal of the amplifier circuit is connected to the second output pin.

6. The motor driver circuit according to claim 5, wherein the motor driver circuit is monolithically integrated on one semiconductor substrate.

7. A positioning device comprising:

a linear motor; and the motor driver circuit of claim 5, the motor driver circuit being configured to drive the linear motor.

8. A hard disk device comprising:

the positioning device of claim 7.

* * * * *